(12) United States Patent
Dikshit et al.

(10) Patent No.: US 8,502,313 B2
(45) Date of Patent: Aug. 6, 2013

(54) DOUBLE LAYER METAL (DLM) POWER MOSFET

(75) Inventors: Rohit Dikshit, Herriman, UT (US);
Mark L. Rinehimer, Mountain Top, PA (US); Michael D. Gruenhagen, Salt Lake City, UT (US); Joseph A. Yedinak, Mountain Top, PA (US); Tracie Petersen, Salt Lake City, UT (US); Ritu Sodhi, Pune (IN); Dan Kinzer, El Segundo, CA (US); Christopher L. Rexer, Mountain Top, PA (US); Fred C. Session, Sandy, UT (US)

(73) Assignee: Fairchild Semiconductor Corporation, South Portland, ME (US)

( * ) Notice: Subject to any disclaimer, the term of this patent is extended or adjusted under 35 U.S.C. 154(b) by 286 days.

(21) Appl. No.: 13/091,578

(22) Filed: Apr. 21, 2011

(65) Prior Publication Data

US 2012/0267714 A1    Oct. 25, 2012

(51) Int. Cl.
*H01L 29/76* (2006.01)

(52) U.S. Cl.
USPC .... 257/341; 257/343; 257/346; 257/E29.257; 257/E21.419; 438/270

(58) Field of Classification Search
USPC .......... 257/341, 343, 346, E29.257, E21.419; 438/270
See application file for complete search history.

(56) References Cited

U.S. PATENT DOCUMENTS

| 4,423,547 | A | 1/1984 | Farrar et al. |
| 5,665,996 | A | 9/1997 | Williams et al. |
| 5,767,546 | A | 6/1998 | Williams et al. |
| 6,051,862 | A | 4/2000 | Grimaldi et al. |
| 6,066,877 | A | 5/2000 | Williams et al. |
| 7,504,306 | B2 * | 3/2009 | Sapp et al. ..................... 438/270 |
| 8,174,067 | B2 * | 5/2012 | Yedinak et al. ............... 257/334 |

* cited by examiner

*Primary Examiner* — Minh-Loan T Tran
(74) *Attorney, Agent, or Firm* — Schwegman Lundberg & Woessner P.A.

(57) ABSTRACT

This document discusses, among other things, a semiconductor device including a first metal layer coupled to a source region and a second metal layer coupled to a gate structure, wherein at least a portion of the first and second metal layers overlap vertically.

23 Claims, 10 Drawing Sheets

DOUBLE LAYER METAL (DLM) POWER MOSFET

BACKGROUND

Many discrete metal oxide semiconductor field effect transistor (MOSFET) device layouts include a gate pad in a die with dimensions large enough to accommodate a bond wire or other attachment. Because of this size requirement, the gate pad can take up a large portion (e.g., 50%, etc.) of a small die. Further, because in many examples there is no active area under the gate pad, the required gate pad size can limit the active area in the semiconductor device.

Figure 1:
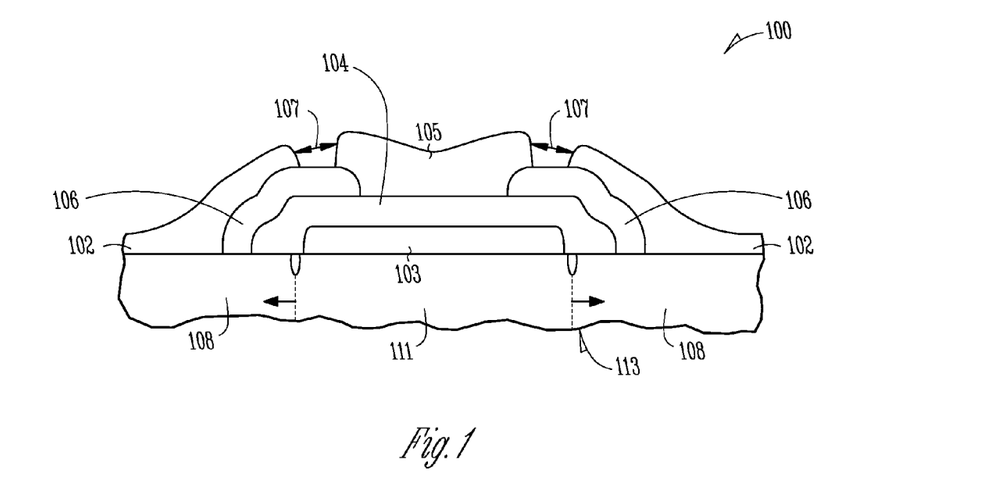
FIG. 1 illustrates generally an example of a gate runner structure.

FIG. 1 illustrates generally an example of a portion of a semiconductor device 100 including a source contact 102, a gate dielectric 103, a gate bus 104, a gate structure 105, a second dielectric 106, and a substrate 113. In certain examples, the gate structure 105 can include a gate pad, a gate runner, or one or more other gate contacts or gate bus structures, and can be sized to provide an adequate bonding area.

In this example, the source contact 102 is isolated from the gate structure 105 by a gap 107 configured to maintain a minimum distance, and provide proper isolation, between the gate structure 105 and the source contact 102, and the source contact 102 is isolated from the gate bus 104 by the second dielectric 106. In various examples, the inactive area of a particular semiconductor device can vary depending on the processing and design parameters used to make and operate the device. In the example of FIG. 1, the edge of the source contact 102 roughly defines an inactive area 111 below the gate bus 104 that limits an active area 108 of the semiconductor device 100. In general, an inactive area of a device, such as a power FET device, is area that cannot be used to create a functional channel to conduct current.

In an example, the active area 108 of the die can include one or more trenches forming an active trench array. In certain examples, one or more gate electrodes disposed in the active trench array can form a portion of a source region of the semiconductor device 100, a portion of which can be laterally offset from the gate structure 105. In certain examples, a lower surface of the substrate 113, substantially opposite a top working surface of the semiconductor device 100, can include a drain region of the semiconductor device 100. In certain examples, the inactive area 111 below the gate structure 105 can have a width greater than about 55 um.

OVERVIEW

This document discusses, among other things, a semiconductor device including a first metal layer coupled to a source region and a second metal layer coupled to a gate structure, wherein at least a portion of the first and second metals layers overlap to provide additional active area for the device without increasing the device size. In certain examples, an inter-metal dielectric can provide electrical isolation between the portions of the first and second metal layers that overlap. In certain examples, a gate structures including pads for external connections and gate runners can include metal portions that overlay active areas of a semiconductor device such as active source areas of a power MOSFET device. In certain examples, a second metal layer forming a source bonding pad can extend to extremes of a device to provide improved heat transfer and current capacity. In certain examples, tie-down vias electrically coupling a poly-silicon gate runner, or an isolated poly-silicon pad, to a metal gate bonding pad can also improve adhesion of the metal gate bonding pad to the device.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

The present inventors have recognized, among other things, a semiconductor device layout having first and second metal structures that at least partially overlap vertically to increase the active area of a semiconductor device without increasing the semiconductor device size. In an example, the semiconductor device layout can include a first metal coupled to a source region and a second metal coupled to a gate structure. In certain examples, the first and second metals can form portions of the first and second metal structures. In an example, a source region can include a source contact, such as a source pad or a source electrode. In other examples, the source region can include a source region of a substrate of a semiconductor device. In an example, the gate structure can include a gate pad, a gate runner, or one or more other gate contact or gate bus structures. In an example, at least a portion of a layer to increase the active area of a device, such as a power FET, without increasing the size of the device die.

In certain examples, the semiconductor device layout described herein can be configured to decrease the inactive area of a semiconductor device, or a semiconductor die including one or more semiconductor devices, in turn increasing the active area of the die or the device without increasing the size of the die or the device. In certain examples, a device according to the present subject matter can be configured to reduce the size of individual semiconductor devices with respect to the gate structure, to provide flexibility in locating or sizing a gate pad on a device or on a die, to increase the available active area of the device by about 5% or more, or to improve the "on" resistance of the device, such as the drain-source resistance ($R_{DS}$) of a power transistor, for example.

Figure 2:
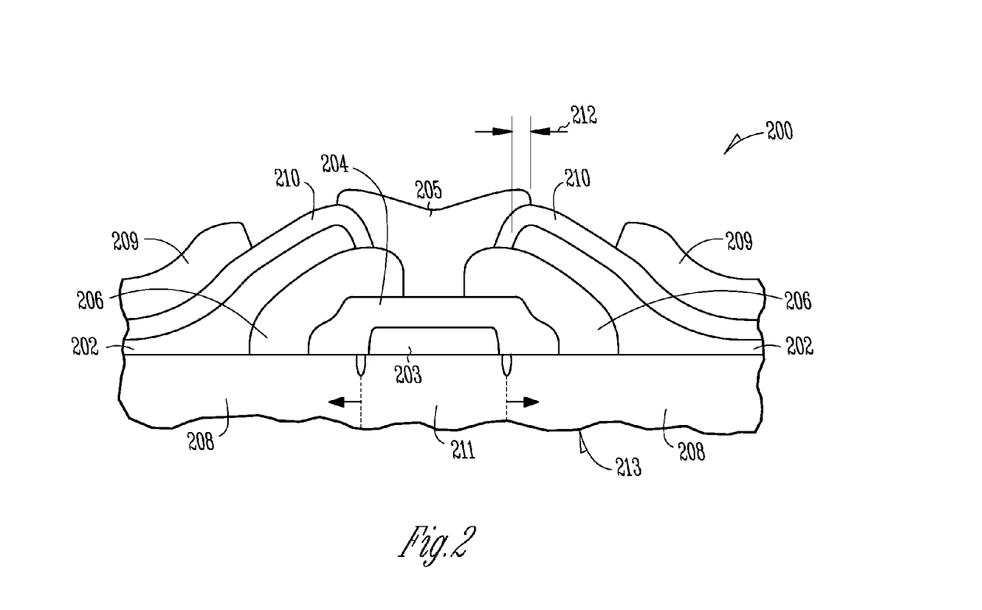
FIG. 2 illustrates generally an example of a portion of semiconductor device, such as a power transistor, according to the present subject matter.

FIG. 2 illustrates generally an example of a portion of a semiconductor device 200, such as a power transistor, including a substrate 213, a source contact 202, a gate dielectric 203, a gate bus 204, a gate structure 205, a second dielectric 206, a source pad 209, and an inter-metal dielectric (IMD) layer 210 extending between the source contact 202 and a gate structure 205. In an example, the gate structure 205 can include a gate pad, a gate runner, or one or more other gate contact or gate bus structure.

In an example, at least a portion of the gate structure 205 can overlap at least a portion of the source region of the semiconductor device 200. In the example of FIG. 2, the IMD layer 210 insulates the gate structure 205 from the source contact 202, allowing at least a portion of the gate structure 205 to overlap at least a portion of the source contact 202, illustrated in FIG. 2 as overlap 212. This enables at least a portion of the source contact 202 to be in closer lateral proximity to, or to overlap, at least a portion of the gate bus 204. As illustrated in FIG. 1, the area under the gate bus 104 was traditionally inactive. However, the present inventors have recognized that, in certain examples, as the width of the gate bus 204 decreases (e.g., while keeping the top width of the gate structure 205 similar to that illustrated in FIG. 1), at least a portion of the active area 208 can laterally approach or vertically overlap (e.g., be underneath) at least a portion of the gate structure 205, subsequently decreasing an inactive area 211 of the semiconductor device 200, or increasing the active area 208 of the semiconductor device 200 with respect to the overall size. In an example, the width of inactive area 211 under the gate structure 205 can be reduced by about 25 um or more, e.g., when compared to a existing devices having an inactive area below a gate structure wider than about 55 um, such as illustrated in the example of FIG. 1. This reduction can result from overlapping metal portions of the gate structure 205 with metal portions of a source structure, or source region. Such techniques can allow lateral isolation gaps between the metal portions of the two structures to be reduced or eliminated and, in some examples, can allow the metal portions of the gate structures to be reduced in width. In an example, the overlapping portion of source contact 202 and the gate structure 205 can represent double metal layers allowing the active area 208 of the semiconductor device 200 to lie beneath a portion of the gate structure 205, such as a gate pad, a gate runner, etc., allowing an increase in the active area 208 of the die without increasing die size. In an example, the gate bus 204 can be configured to be coupled to one or more gate trenches forming a portion of the active area 208 of the die including the semiconductor device 200. Although the example of FIG. 2 is illustrated with reference to a power transistor, it is understood that semiconductor devices incorporating the present subject matter can include, but are not limited to, power Metal Oxide Semiconductor (MOS) Field-Effect Transistors (FET5), planar MOSFETs, Double Diffusion MOS (DMOS), Drain-in-the-back DMOS, Trench MOSFETs, including charge bound devices such as shielded gate devices, Insulated Gate Bipolar Transistors (IGBTs), MOS-Controlled Thyristors (MCTs) and temperature sense and current sense MOS devices. In an example, the source contact 202 can include a first metal layer material including, but not limited to, aluminum (Al), aluminum silicon (AlSi), aluminum silicon copper (AlSiCu), copper (Cu), or one or more other metals or combinations thereof and can include an underlying barrier metal such as Titanium (Ti), Titanium Tungsten (TiW), or Titanium Nitride (TiN). The gate structure 205 can include a second metal layer including, but not limited to, electroless nickel gold (ENiAu), titanium nickel silver (TiNiAg), titanium nickel vanadium silver (TiNiVAg), copper (Cu), solderable metals such as Tin (Sn), or one or more other metals or combinations thereof.

Example Processing Steps

Figure 3:
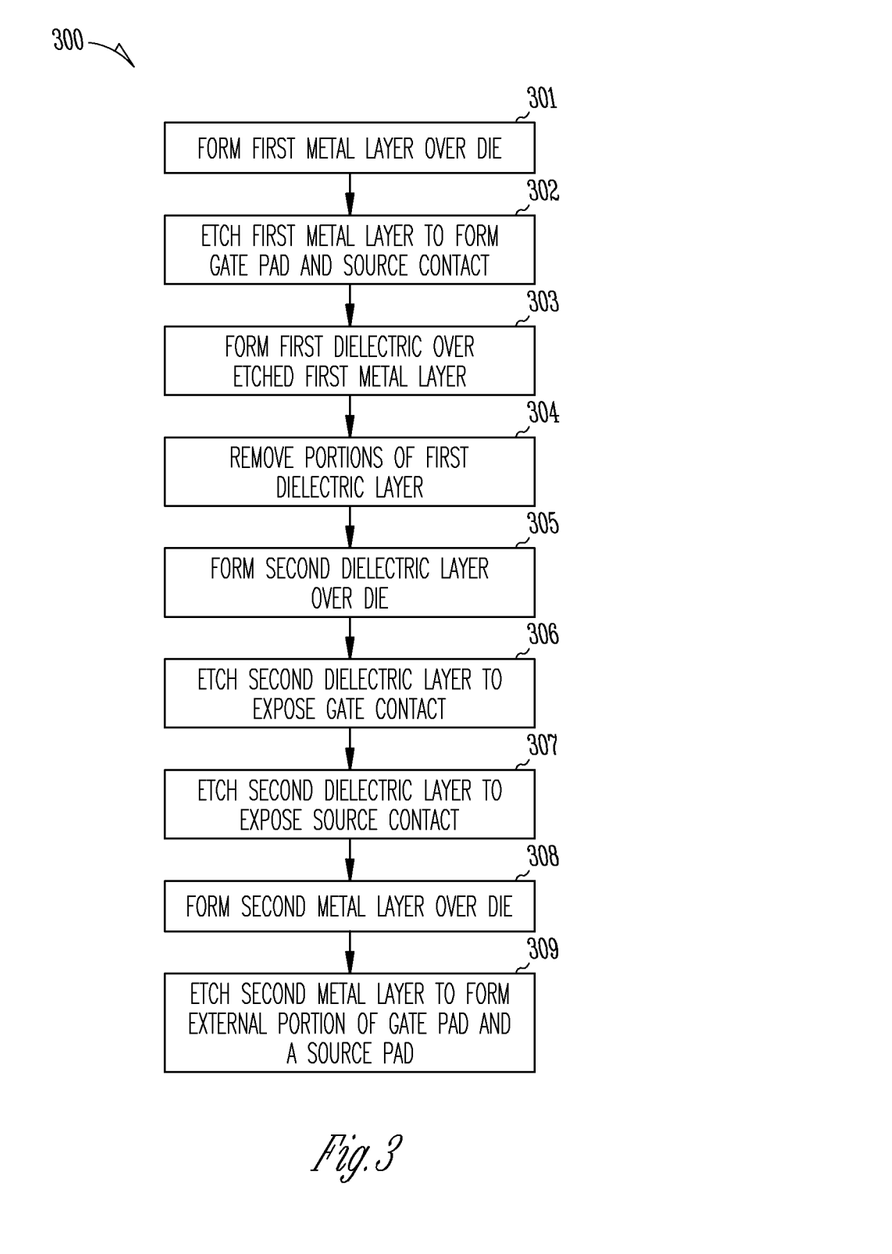
FIG. 3 illustrates generally an example of a method of making a portion of a semiconductor structure such as that illustrated in the examples of FIGS. 2 and 3.

FIG. 3 illustrates generally an example of a method 300 of making a portion of a semiconductor device, such as that illustrated in the example of FIG. 2. At 301, for example, after a substrate has been doped and trenches and gate buses formed, a first metal layer can be formed over a die. At 302, gaps or openings in the first metal layer can be etched to form a portion of a gate pad and a source contact. At 303, a first dielectric layer can be formed over the etched first metal layer. At 304, the first dielectric layer can be removed except for portions of the first dielectric material within the etched gaps of the first metal layer. At 305, a second dielectric layer can be formed over the etched first layer of metal and the dielectric filled gaps of the first metal layer. At 306, gaps or openings in the second dielectric layer can be etched to expose a portion of the first metal later comprising a portion of the gate pad. At 307, gaps or openings in the second dielectric layer can be etched to expose a portion of the first metal layer comprising a source contact. At 308, a second metal layer can be formed over the second dielectric layer and the exposed portions of the first metal layer. At 309, the second metal layer can be etched to form the gate pad and the source pad. In certain examples, the gate pad can be configured to overlap a portion of the source contact and can be isolated from the source contact by un-etched portions of the second dielectric layer. In certain examples, at least a portion of the first metal layer can be thinner than at least a portion of the second metal layer allowing the separation dimensions of the first and second metal layers to be reduced and, consequently, providing an increase in the potential active area of the die. In an example, the first metal can be thinner than the second metal where the first and second metals overlap.

In certain examples, at 304 and 305, portions of the first dielectric layer are not removed and the second dielectric layer is not formed. In such examples, vias can be formed through etched portions of the first metal layer to allow the second metal layer to contact the gate bus and the source contact. In certain examples, one or more of the vias can be lined with a dielectric to isolate the interior of the via from the first metal layer. In some embodiments, tie down vias can be formed to reduce the resistance of the gate pad and to improve mechanical adhesion between the second metal layer forming the gate pad and the first dielectric layer. After forming the vias, the second metal layer can be formed on the first dielectric layer and etched to define a gate pad, one or more source bonding pads, and one or more optional gate runners.

Figure 4A:
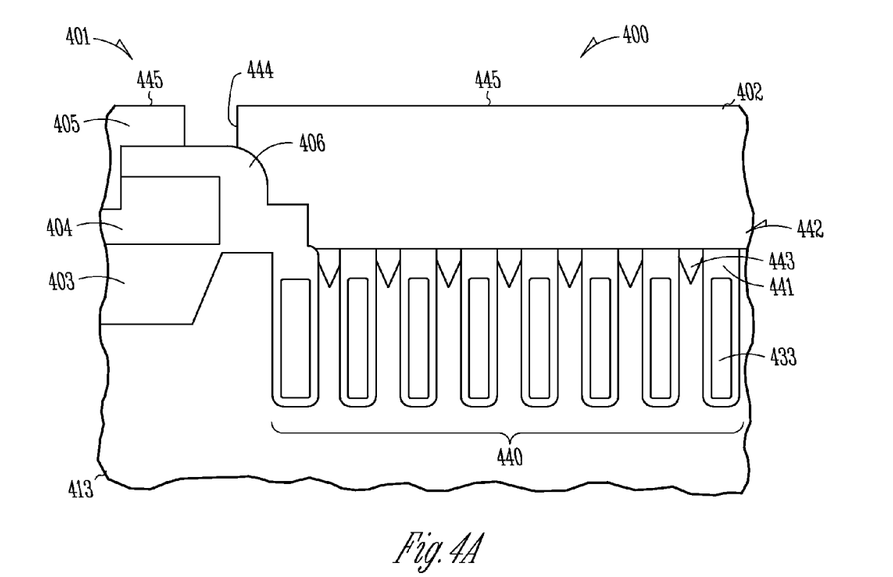
FIGS. 4A-4G illustrate generally an example of a method of making a portion of a semiconductor structure.

FIGS. 4A-4G illustrate generally examples of processing steps for a semiconductor device layout described herein. FIG. 4A illustrates generally an example of a portion of a semiconductor device 400 including a gate structure 401 (e.g., a gate pad, a gate runner, or one or more other gate contact or gate bus structure) and a plurality of trenches 440 in a substrate 413, each trench including a gate electrode 433, such as a poly-silicon electrode. In an example, the gate electrode 433 can be isolated from the substrate 413 by a trench dielectric 441. In certain examples, each of the plurality of trenches 440 can include one or more isolated electrodes. A working surface 442 of the substrate 413 can include a doped source region 443 between successive trenches of the plurality of trenches 440. In an example, the gate structure 401 can include a gate bus 404, such as a poly-silicon gate bus, a dielectric 403 configured to isolate the gate bus 404 from the substrate 413, and a dielectric layer 406 configured to isolate at least a portion of the gate structure 401 from a portion of a source area above the plurality of trenches 440. In an example, a first metal layer 445 can be disposed over the substrate 413. The first metal layer 445 can include a gap 444 (e.g., an etched gap) configured to define a portion of a gate pad 405 and a portion of a source contact 402.

Figure 4B:
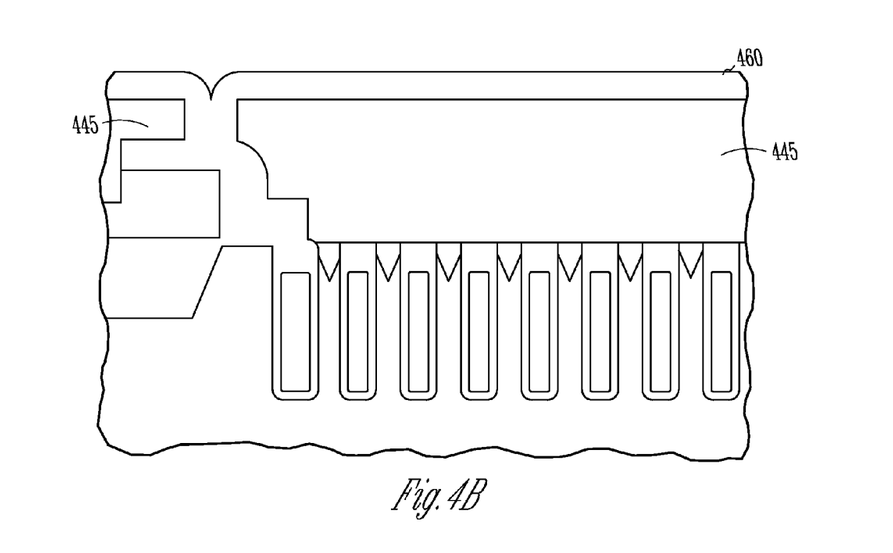

FIG. 4B illustrates generally an example of a first dielectric material 460 disposed over the first metal layer 445.

Figure 4C:
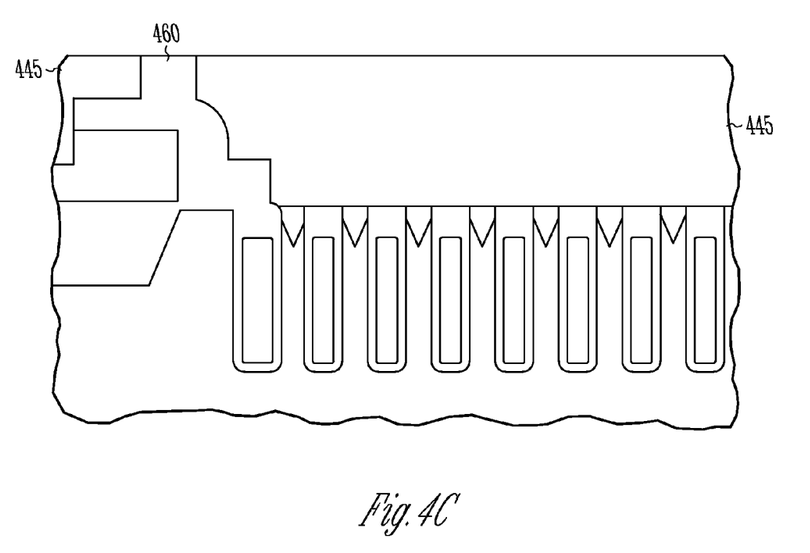

FIG. 4C illustrates generally an example of remaining portions of the first dielectric material 460 after removal from the first metal layer 445.

Figure 4D:
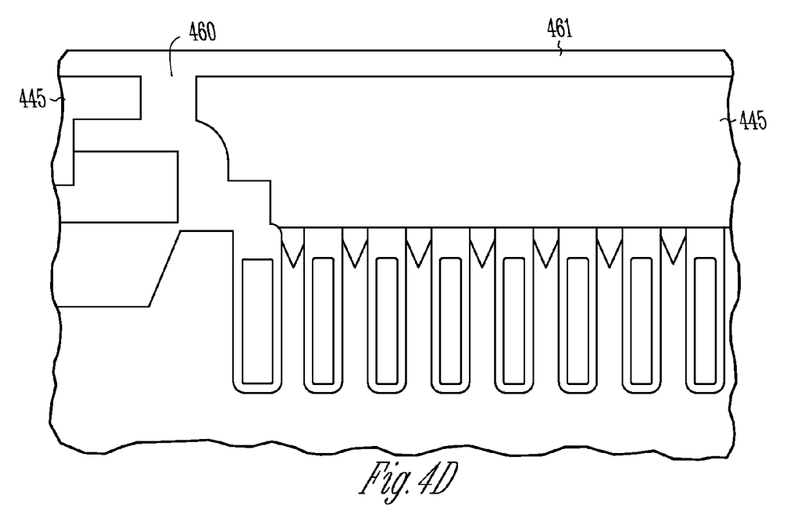

FIG. 4D illustrates generally an example of a second dielectric material 461 disposed over the first metal layer 445 and the remaining portions of the first dielectric material 460. In certain examples, the first dielectric material 460 and the second dielectric material 461 are the same dielectric material.

Figure 4E:
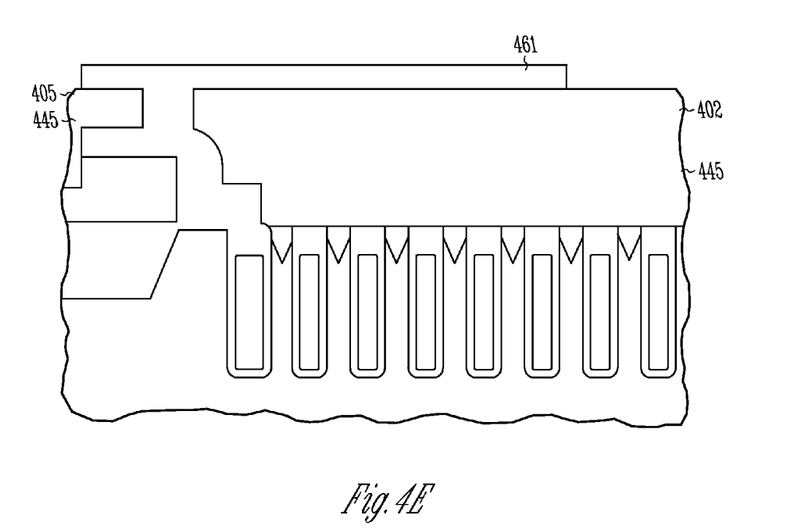

FIG. 4E illustrates generally an example of remaining portions of the second dielectric material 461 after etching to expose portions the first metal layer 445, including a portion of a gate pad 405 and a portion of a source contact 402.

Figure 4F:
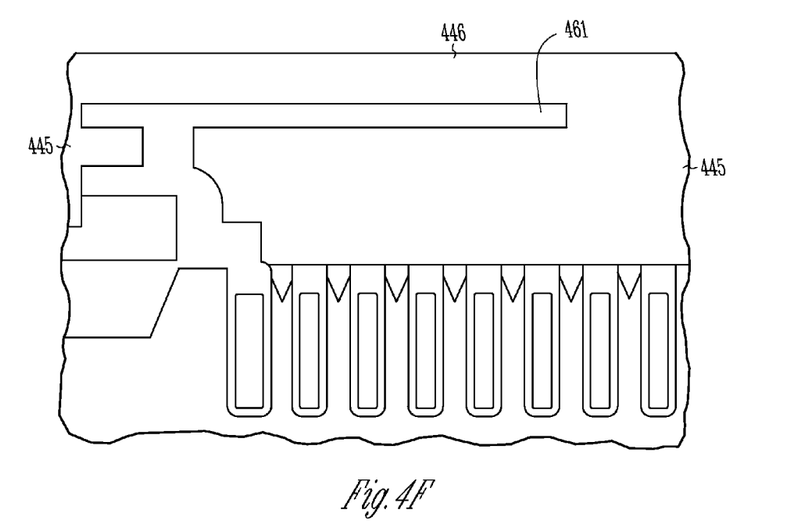

FIG. 4F illustrates generally an example of a second metal layer 446 overlaying the remaining portion of the second dielectric material 461 and the exposed portions of the first metal layer 445.

Figure 4G:
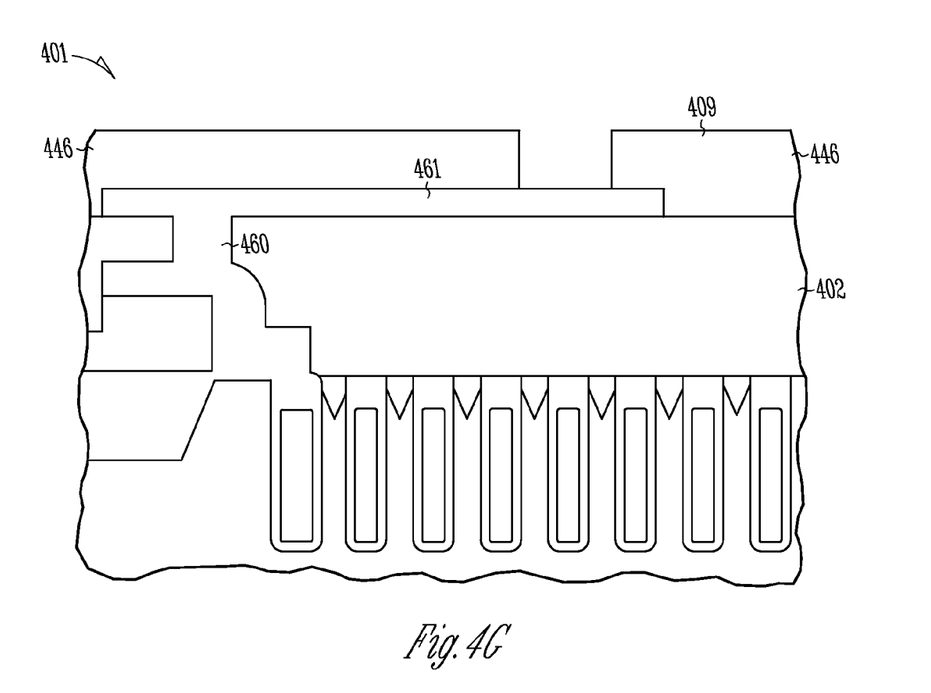

FIG. 4G illustrates generally an example of remaining portions of the second metal layer 446 after etching to isolate the gate structure 401 from a source pad 409. The combination of the first and second dielectric materials 460, 461 allow a portion of the source contact 402 to underlay a portion of the second metal layer 446 forming a portion of the gate structure 401. The portion of the source contact 402 underlying the metal portion of the gate structure 401 represents an increase in active area of a die with respect to single metal layer structures.

Figure 5A:
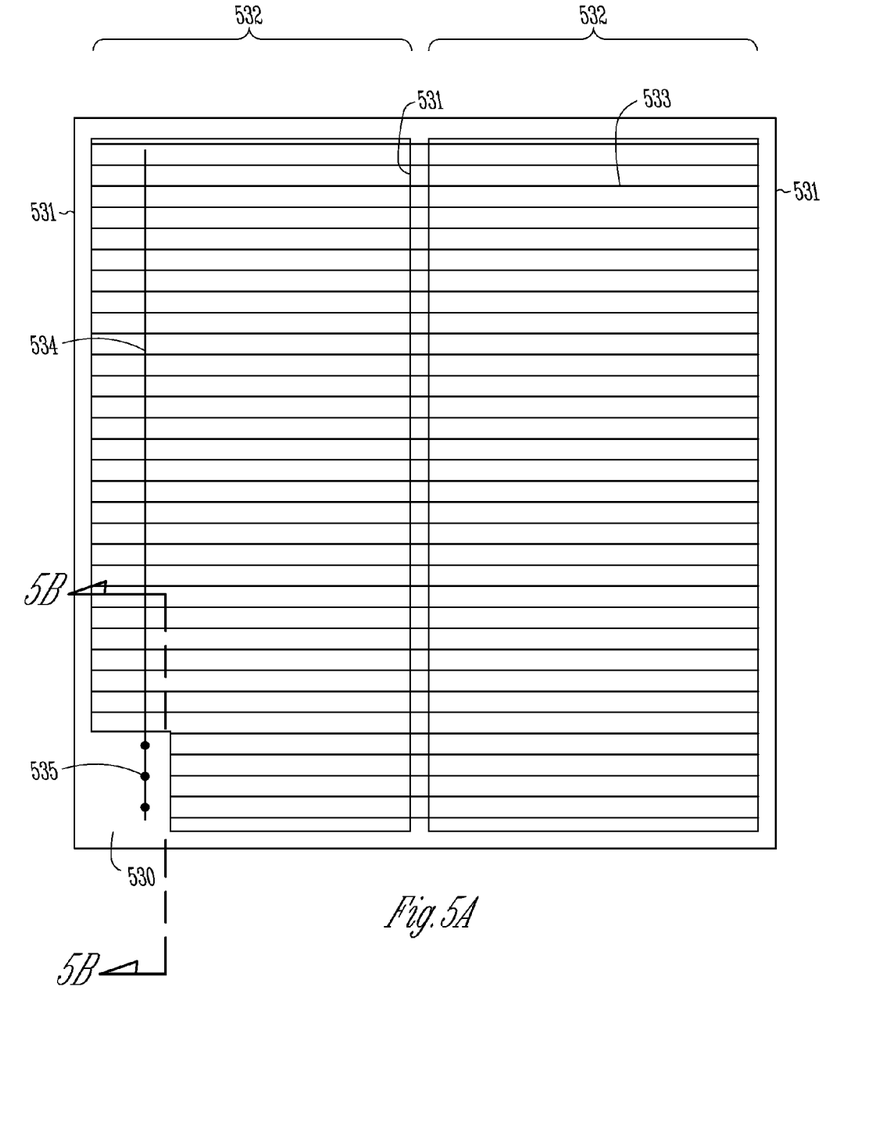
FIG. 5A illustrates generally a top view of an example of a semiconductor device.

FIG. 5A illustrates generally a top view of an example of a semiconductor die 500 including a gate pad 530, gate runners 531, and source pads 532. In an example, a plurality of gate trench electrodes, such as a gate trench electrode 533, can be configured to form a portion of an active area under a source contact coupled to the source pads 532, and can be configured to couple to one or more of the gate runners 531. In general, the gate pad 530 can be coupled to the active areas of the semiconductor die 500 using one or more of the gate runners 531 or the gate trench electrodes.

The gate pad 530 can be exposed to external forces communicated thru the bonding medium, among other things. In certain examples, the forces can act to separate the external second metal layer of the gate pad 530 from an underlying inter-metal dielectric (IMD). In certain examples, the gate pad 530 can be coupled to a buried gate runner 534 of the semiconductor die 500 using one or more tie down vias, such as a tie down via 535. In addition to providing a more robust mechanical coupling of the metal layer of the gate pad 530 to the underlying structure of the semiconductor die 500, the tie down via 535 can reduce the gate resistance of the device 500. In certain examples, the buried gate runner can be integrated with the substrate of the semiconductor die. In certain examples, the buried gate runner can underlie a plane of the first metal layer. In certain examples, the buried gate runner can be co-planar with the first metal layer.

Figure 5B:
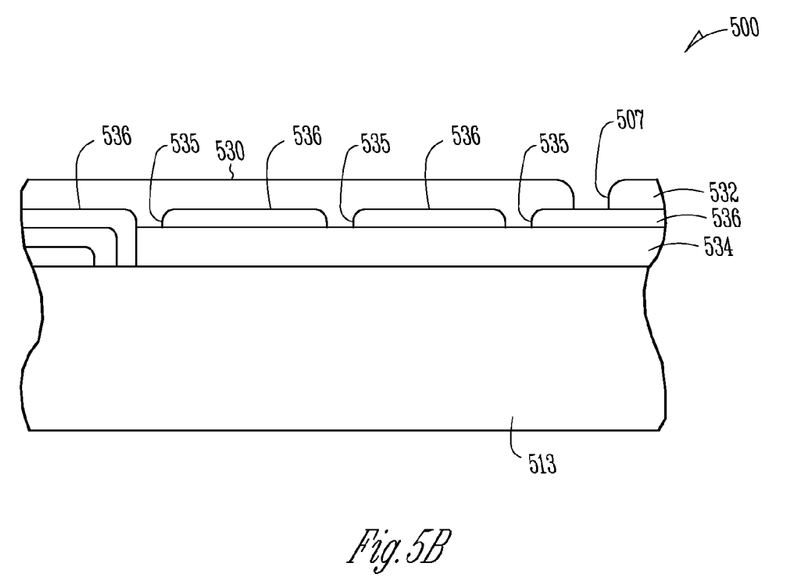
FIG. 5B illustrates generally a cross-section of an example of a semiconductor device having a trenched gate runner coupled to second metal layer gate pad using a tie-down via.
Figure 8:
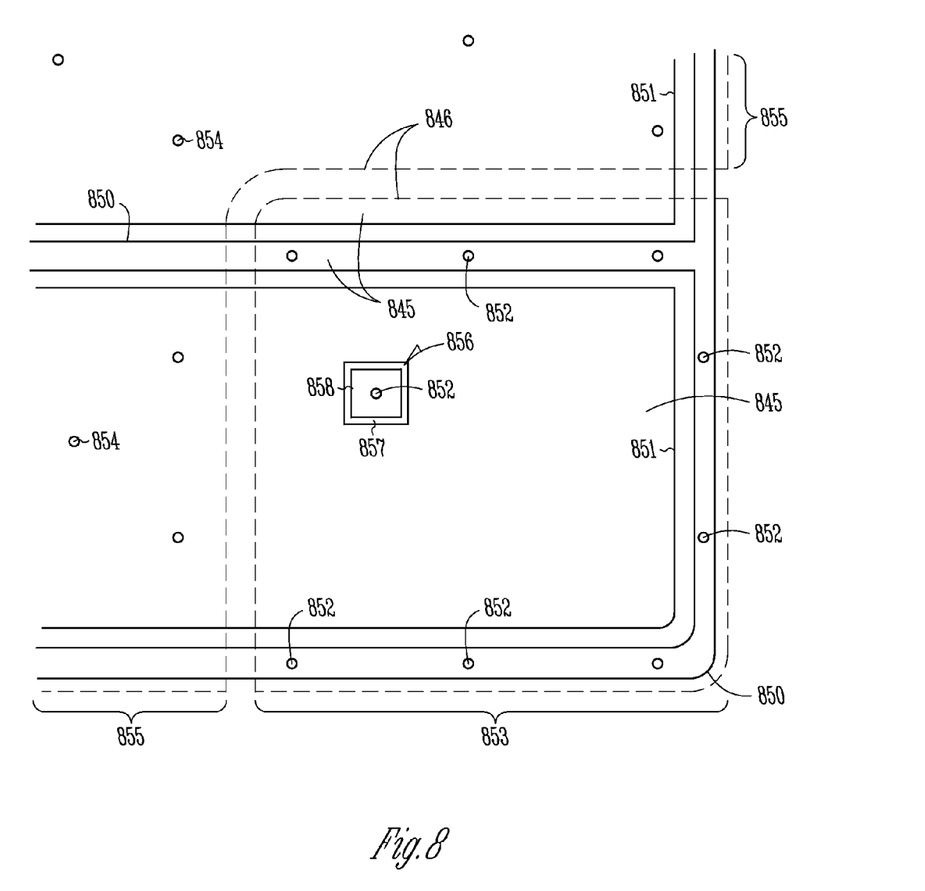
FIG. 8 illustrates generally an example of a gate runner structure including a buried first metal gate runner configuration.

FIG. 5B illustrates generally an example of a cross-section of a portion of a semiconductor die 500 having a gate pad 530 coupled to a buried gate runner, such as polygate runner 534, using a tie-down via 535. In certain examples, one or more tie-down vias 535 extending through an inter-metal dielectric (IMD) 536 can couple the gate pad 530 to the buried polygate runner 534. As the polygate runner 534 extends past an edge of the gate pad 530, the IMD 536 can isolate the buried poly gate runner 534 from a source pad 532. The tie-down vias coupling the buried polygate runner 534 to the gate pad 530 can reinforce adhesion of the metal gate pad to the device. In an example, instead of several individual tie down vias 535, a single, thin, tie-down via, extending with the length of the buried gate runner 534, can couple the gate pad 530 to the underlying portion of the buried polygate runner 534. In certain examples, adhesion of the gate pad 530 can be reinforced by coupling the gate pad 530 to isolated, poly-silicon gate pad structures underlying the gate pad 530. An example of an isolated gate pad is illustrated in FIG. 8.

Figure 6:
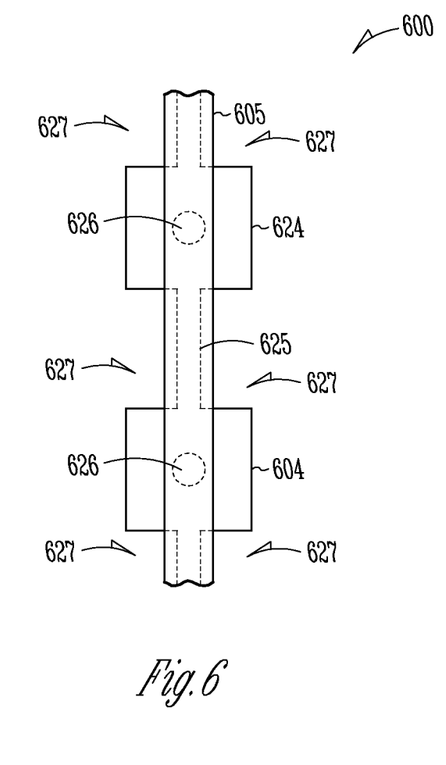
FIGS. 6-7 illustrate generally examples of segmented second metal layer gate runner structures.

FIG. 6 illustrates generally an example of a segmented gate runner structure 600 (e.g., a segmented, second-metal gate runner structure) including a gate runner 605 composed of selected gate bus pads 604, 624 (e.g., poly-silicon gate bus pads) optionally coupled together using a thinner gate runner 625 (e.g. a poly-silicon gate runner thinner than the selected gate bus pads 604, 624 or the gate runner 605). In an example, the gate runner 605 can be optionally coupled to selected gate bus pads, such one or more of the selected gate bus pads 604, 624, using one or more vias, such as vias 626. In an example, an increased active area of a semiconductor die or a semiconductor device including the segmented gate runner structure 600 can be achieved using the thinner gate runner 625, or by optionally extending a first metal layer comprising a source contact (not shown) into the areas 627 bounded in part by adjacent selected gate bus pads 604, 624 and the thinner gate runner 625. In certain examples, a continuous sheet of the first metal layer can bridge across the gate runners 625. The sheet can extend between the gate bus pads 604, 624, as long as the sheet is electrically isolated from the thin gate runners 625.

Figure 7:
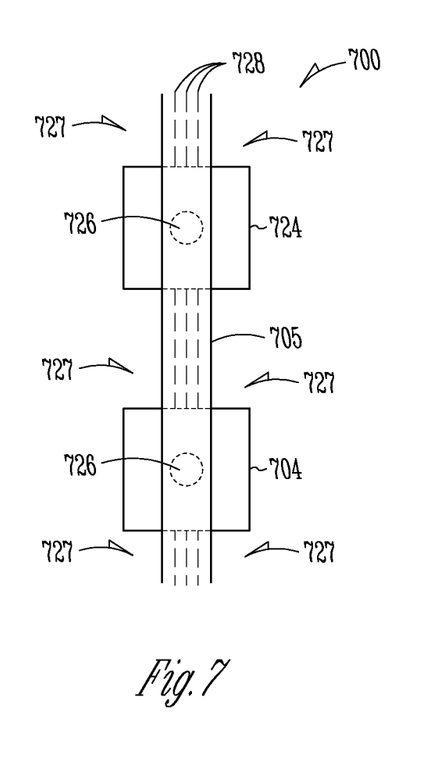

FIG. 7 illustrates generally an example of a segmented gate runner structure 700 including a plurality of gate bus pads 704, 724 (e.g., poly-silicon gate pads). In an example, one or more of the plurality of gate bus pads 704, 724 can be optionally coupled together via one or more trench lines 728 intersecting the plurality of gate bus pads 704, 724. In an example, the plurality of gate bus pads 704, 724 can at least partially overlap a first metal layer (not shown) forming a portion of a source contact. In other examples, one or more of the plurality of gate bus pads 704, 724 can be further or otherwise coupled to each other using a second metal layer forming a gate runner 705 and one or more vias, such as vias 726. Each connection between the gate runner 705 and the plurality of gate bus pads 704, 724 can include a via through one or more of an inter-metal dielectric, an etched gap in the first metal layer, or a dielectric adjacent the pad. Increased active area can be achieved by etching the first metal layer forming the source contact around the vias 726 coupling one or more of the plurality of gate bus pads 704, 724 to the overlapping gate runner 705.

In an example, a segmented gate runner structure 700 formed using a second metal layer can allow a first metal layer, including a source contact, to intermittently bridge a gate runner 705 to electrically couple active areas of a semiconductor device segregated by the gate runner 705.

FIG. 8 illustrates generally an example of an alternative gate runner structure including a buried first metal gate runner configuration. In an example, a semiconductor die 800 can include a first metal layer 845 formed over the die 800 and etched to form gate runners 850 and source contact areas 851. An inter-metal dielectric (IMD) (not shown) can be configured to isolate the first metal layer 845 from a second metal layer 846 formed over the IMD and etched to define a source pad 855 and a gate pad 853. In an example, gate vias 852 can be configured to couple the gate runners 850, formed from the first metal layer, to the gate pad 853, formed from the second metal layer. In addition to providing electrical coupling, the gate vias 852 provide mechanical coupling, or adhesion, between the gate pad 853 and the underlying device components. As discussed above, existing devices include a poly-silicon gate structure under the gate pad such that almost the entire area under the gate pad is inactive. A device using gate runners 850, with an underlying layer of poly silicon, does not require the use of a large polysilicon gate structure, therefore, substantially the entire area under the gate pad 853 can be active. Therefore, a device according to the present subject matter can include significant additional active area with respect to existing devices without increasing the device size.

In certain examples, the gate pad 853 can be coupled to poly-silicon gate pad structures 856 underlying the metal gate pad 853 using one or more gate, or tie-down, vias 852 to provide additional adhesion of the second metal layer gate pad 853 to the underlying device structure. An isolated poly-silicon gate pad structure 856 can include a poly-silicon pad 858 and an isolation gap 857 to isolate the poly-silicon pad 858, or via 852, from a surrounding source contact area 851. In certain examples, the isolation gap 857 can include dielectric material isolating the first metal layer from the poly-silicon pad 858, or an inter-metal dielectric material isolating the first metal layer from the second metal layer, or both types of dielectric materials.

In an example, source vias 854 can couple the source contact areas 851 formed from the first metal layer 845 to the source pad 855 formed from the second metal layer 846. In certain examples, instead of or in addition to source vias 854, large windows can be etched in the IMD separating the first metal layer, forming the source contact areas 851, from the second metal layer, forming the source pad 855. In an example, the etched windows can be filled with metal, such as metal forming the second metal layer, to electrically couple the source pad 855 with the source contact areas 851.

In an example, the buried nature of the gate runners 850 formed from the first metal layer 845 can allow for a larger source contact pad 855 formed from the second metal layer 846 compared to a device having gate runners formed from the second metal layer as discussed above. In an example, the increased source contact pad 855 area can provide improved heat and current conduction, as well as a larger bonding area for bonding media, including, but not limited to, solderable bonding media or bonding clips for attaching conductors to devices or packaging external to the semiconductor die.

Additional Notes

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In Example 1, a semiconductor device includes a semiconductor region that can include a gate structure and a source region. At least a portion of the source region can be laterally offset from the gate structure. The semiconducor device can also include a first metal layer coupled to the source region, a second metal layer coupled to the gate structure, and wherein at least a portion of the first and second metal layers overlap vertically.

In Example 2, the gate structure of Example 1 optionally includes a gate runner.

In Example 3, the gate structure of any one or more of Examples 1-2 optionally includes a gate pad.

In Example 4, the semiconductor device of any one or more of Examples 1-3 optionally includes a poly-silicon gate bus vertically offset from the gate pad, and a tie-down via coupling the poly-silicon gate bus to the gate pad.

In Example 5, at least a portion of the second metal layer of any one or more of Examples 1-4 optionally extends laterally over at least a portion of the first metal layer.

In Example 6, the semiconductor device of any one or more of Examples 1-5 optionally includes an inter-metal dielectric (IMD) configured to at least partially isolate the first metal layer from the second metal layer.

In Example 7, at least a portion of the second metal layer of any one or more of Examples 1-6 optionally extends laterally over at least a portion of the source region.

In Example 8, the semiconductor region of any one or more of Examples 1-7 optionally includes a drain region, a first surface including the gate structure, and a second surface, substantially opposite the first surface, the second surface including the drain region, wherein the source region extends from the first surface towards the second surface.

In Example 9, the first surface of any one or more of Examples 1-8 optionally includes a working top surface of the semiconductor region, and the gate structure of any one or more of Examples 1-8 can include a poly-silicon gate formed on the first surface of the semiconductor region.

In Example 10, the source region of any one or more of Examples 1-9 optionally is formed in the first surface of the semiconductor region.

In Example 11, the semiconductor device of any one or more of Examples 1-10 optionally includes a double layer metal (DLM) metal oxide semiconductor field-effect transistor (MOSFET), including a double-diffused metal oxide semiconductor (DMOS) device including an active trench array having a plurality of source regions, and the second metal layer of any one or more of Examples 1-10 is optionally configured to couple to more than one of the plurality of source regions.

In Example 12, the vertically overlapping portion of the first and second metal layers of any one or more of Examples 1-11 are optionally configured to provide an increased active area in the semiconductor device with respect to the first metal layer.

In Example 13 the second metal layer of any one or more of Examples 1-12 optionally includes a wire-bondable, clip attachable, or solderable layer, at least a portion of the second metal layer of any one or more of Examples 1-12 optionally includes at least one of electroless nickel gold (ENiAu), titanium nickel silver (TiNiAg), titanium nickel vanadium silver (TiNiVAg), or copper (Cu), and at least a portion of the first metal layer of any one or more of Examples 1-11 optionally includes at least one of aluminum (Al), aluminum silicon (AlSi), aluminum silicon copper (AlSiCu), or copper (Cu).

In Example 14, at least a portion of the first metal layer of any one or more of Examples 1-13 is optionally thinner than the second metal layer.

In Example 15, at least a portion of the first metal layer of any one or more of Examples 1-14 is optionally thinner than a portion of the second metal layer overlaying the first metal layer.

In Example 16, the semiconductor device of any one or more of Examples 1-15 optionally includes a segmented poly-silicon gate bus vertically offset from at least a portion of the first metal layer, the segmented poly-silicon gate bus optionally configured to allow selective coupling to a gate runner using vias.

In Example 17, the semiconductor device of any one or more of Examples 1-16 optionally includes a buried gate bus, vertically offset from at least a portion of the second metal layer, at least partially insulated from the second metal layer using an inter-metal dielectric (IMD), and coupled to the first metal layer using at least one via.

In Example 18, a method of increasing an active area of a semiconductor device including a source region at least partially laterally offset from a gate structure, such as in of any one or more of Examples 1-17, optionally includes providing a first metal layer coupled to the source region, and providing a second metal layer at least partially vertically overlapping the first metal layer, the second metal layer coupled to the gate structure.

In Example 19, the method of any one or more of Examples 1-18 optionally include providing a poly-silicon gate bus vertically offset from a gate pad of the gate structure and coupling the poly-silicon gate bus to the gate pad using a tie-down via.

In Example 20, the providing the second metal layer at least partially vertically overlapping the first metal layer of any one or more of Examples 1-19 optionally includes providing at least a portion of the second metal layer laterally over at least a portion of the source region.

In Example 21, the semiconductor device of any one or more of Examples 1-20 optionally includes a double layer metal (DLM) metal oxide semiconductor field-effect transistor (MOSFET), including a double-diffused metal oxide semiconductor (DMOS) device including an active trench array having a plurality of source regions, and the method of any one or more of Examples 1-20 optionally includes coupling the second metal layer to more than one of the plurality of source regions.

In Example 22, the providing the first metal layer of any one or more of Examples 1-21 optionally includes providing at least a portion of the first metal layer that is thinner than the second metal layer.

In Example 23, the providing the at least a portion of the first metal layer that is thinner than the second metal layer of any one or more of Examples 1-22 optionally includes providing at least a portion of the first metal layer that is thinner than the second metal layer overlaying the first metal layer.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, the code can be tangibly stored on one or more volatile or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A semiconductor device comprising:
    a semiconductor region including:
        a gate structure; and
        a source region, wherein at least a portion of the source region is laterally offset from the gate structure;
    a first metal layer coupled to the source region;
    a second metal layer coupled to the gate structure; and
    wherein at least a portion of the first and second metal layers overlap vertically.

2. The semiconductor device of claim 1, wherein the gate structure includes a gate runner.

3. The semiconductor device of claim 1, wherein the gate structure includes a gate pad.

4. The semiconductor device of claim 3, including:
a poly-silicon gate bus vertically offset from the gate pad; and
a tie-down via coupling the poly-silicon gate bus to the gate pad.

5. The semiconductor device of claim 1, wherein at least a portion of the second metal layer extends laterally over at least a portion of the first metal layer.

6. The semiconductor device of claim 1, including an inter-metal dielectric (IMD) configured to at least partially isolate the first metal layer from the second metal layer.

7. The semiconductor device of claim 1, wherein at least a portion of the second metal layer extends laterally over at least a portion of the source region.

8. The semiconductor device of claim 1, wherein the semiconductor region includes:
a drain region;
a first surface including the gate structure; and
a second surface, substantially opposite the first surface, the second surface including the drain region;
wherein the source region extends from the first surface towards the second surface.

9. The semiconductor device of claim 8, wherein the first surface includes a working top surface of the semiconductor region; and
wherein the gate structure includes a poly-silicon gate formed on the first surface of the semiconductor region.

10. The semiconductor device of claim 9, wherein the source region is formed in the first surface of the semiconductor region.

11. The semiconductor device of claim 1, wherein the semiconductor device includes a double layer metal (DLM) metal oxide semiconductor field-effect transistor (MOSFET), including a double-diffused metal oxide semiconductor (DMOS) device including an active trench array having a plurality of source regions; and
wherein the second metal layer is configured to couple to more than one of the plurality of source regions.

12. The semiconductor device of claim 1, wherein the vertically overlapping portion of the first and second metal layers are configured to provide an increased active area in the semiconductor device with respect to the first metal layer.

13. The semiconductor device of claim 1, wherein the second metal layer includes a wire-bondable, clip attachable, or solderable layer;
wherein at least a portion of the second metal layer includes at least one of electroless nickel gold (ENiAu), titanium nickel silver (TiNiAg), titanium nickel vanadium silver (TiNiVAg), or copper (Cu); and
wherein at least a portion of the first metal layer includes at least one of aluminum (Al), aluminum silicon (AlSi), aluminum silicon copper (AlSiCu), or copper (Cu).

14. The semiconductor device of claim 1, wherein at least a portion of the first metal layer is thinner than the second metal layer.

15. The semiconductor device of claim 14, wherein at least a portion of the first metal layer is thinner than a portion of the second metal layer overlaying the first metal layer.

16. The semiconductor device of claim 1, including a segmented poly-silicon gate bus vertically offset from at least a portion of the first metal layer, the segmented poly-silicon gate bus configured to allow selective coupling to a gate runner using vias.

17. The semiconductor device of claim 1, including a buried gate bus vertically offset from at least a portion of the second metal layer, at least partially insulated from the second metal layer using an inter-metal dielectric (IMD), and coupled to the first metal layer using at least one via.

18. A method of increasing an active area of a semiconductor device including a source region at least partially laterally offset from a gate structure, the method comprising:
providing a first metal layer coupled to the source region; and
providing a second metal layer at least partially vertically overlapping the first metal layer, the second metal layer coupled to the gate structure.

19. The method of claim 18, including:
providing a poly-silicon gate bus vertically offset from a gate pad of the gate structure; and
coupling the poly-silicon gate bus to the gate pad using a tie-down via.

20. The method of claim 18, wherein the providing the second metal layer at least partially vertically overlapping the first metal layer includes providing at least a portion of the second metal layer laterally over at least a portion of the source region.

21. The method of claim 18, wherein the semiconductor device includes a double layer metal (DLM) metal oxide semiconductor field-effect transistor (MOSFET), including a double-diffused metal oxide semiconductor (DMOS) device including an active trench array having a plurality of source regions, and wherein the method includes:
coupling the second metal layer to more than one of the plurality of source regions.

22. The method of claim 18, wherein the providing the first metal layer includes providing at least a portion of the first metal layer that is thinner than the second metal layer.

23. The method of claim 22, wherein the providing the at least a portion of the first metal layer that is thinner than the second metal layer includes providing at least a portion of the first metal layer that is thinner than the second metal layer overlaying the first metal layer.

* * * * *